(12) United States Patent
Swaminathan

(10) Patent No.: US 7,228,478 B2
(45) Date of Patent: Jun. 5, 2007

(54) BUILT-IN SELF-TEST (BIST) FOR HIGH PERFORMANCE CIRCUITS

(75) Inventor: Shivakumar Swaminathan, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 10/915,981

(22) Filed: Aug. 11, 2004

(65) Prior Publication Data

US 2006/0036920 A1    Feb. 16, 2006

(51) Int. Cl.
G01R 31/3183   (2006.01)
G01R 31/3185   (2006.01)

(52) U.S. Cl. .................. 714/738; 714/735

(58) Field of Classification Search ............ 714/738, 714/741, 735, 733, 732, 728, 25, 30
See application file for complete search history.

(56) References Cited

U.S. PATENT DOCUMENTS

| | | | |
|---|---|---|---|
| 4,476,495 A * | 10/1984 | Fujisawa et al. ............. 382/245 |
| 5,726,996 A | 3/1998 | Chakradhar et al. ......... 371/22.1 |
| 5,781,718 A | 7/1998 | Nguyen ................. 395/183.09 |
| 5,961,653 A | 10/1999 | Kalter et al. ................... 714/7 |
| 6,041,429 A | 3/2000 | Koenemann ................ 714/735 |
| 6,249,893 B1 * | 6/2001 | Rajsuman et al. ........... 714/741 |
| 6,415,408 B1 | 7/2002 | Rhodes et al. .............. 714/738 |
| 6,449,743 B1 * | 9/2002 | Hosokawa ................ 714/738 |
| 6,480,980 B2 | 11/2002 | Koe ........................ 714/738 |
| 6,490,711 B2 | 12/2002 | Buckley, Jr. .................. 716/5 |
| 6,519,725 B1 | 2/2003 | Huisman et al. ............ 714/718 |

FOREIGN PATENT DOCUMENTS

KR      2003050394 A  *  6/2003

OTHER PUBLICATIONS

J. Savir, et al., "A Multiple Seed Linear Feedback Shift Register", IEEE 1990 paper 30.1, pp. 657-659.
K. Chakrabarty and S. Swaminathan, "Built-in Self Testing of High-Performance Circuits Using Twisted-Ring Counters", IEEE 2000, pp. I-72-I-75.
J. Riegler et al. "Method and Apparatus for Testing A VLSI Device", Sep. 15, 1990, IBM Dossier DE9199900018.

* cited by examiner

Primary Examiner—Guy Lamarre
Assistant Examiner—Dipakkumar Gandhi
(74) Attorney, Agent, or Firm—Joscelyn G. Cockburn; Schubert Osterrieder & Nickelson PLLC

(57) ABSTRACT

Test patterns for testing electrical circuits are generated by a MUX having its output operatively coupled to a Scan-In shift register and inputs receiving seed pattern signals, response signal from a response shift register, positive and negative signals from the Scan-In register. A control logic circuit provides control signals that enable the MUX to select appropriate input signals. The circuit arrangement enables relatively few seed patterns to generate relatively large number of test patterns. The seed patterns are a sub-set of a test pattern set preferably generated by software such as the Automatic Test Pattern Generator (ATPG). A method to generate the seed patterns is, also, provided.

15 Claims, 5 Drawing Sheets

100

BUILT-IN SELF-TEST (BIST) FOR HIGH PERFORMANCE CIRCUITS

BACKGROUND OF THE INVENTION

1. Field of the Invention

The present invention relates to integrated circuits in general and particularly to BIST macro or sub-system for testing high performance circuits.

2. Prior Art

The use of on-chip macros or BIST to generate test patterns which test various types of faults associated with electrical circuits are well known in the prior art. The prior art on-chips macros for testing faults are based on different types of architecture. One of the prior art architectures to which the present invention relates is the Twisted Ring Counter (TRC) based BIST. In this architecture the input scan register that provides test patterns to a Device Under Test (DUT) is reconfigured into a twisted ring counter whose outputs are correlated with initial test patterns called "seeds" to generate the test patterns used to test circuits.

Perhaps the most desirable characteristics of this type of architecture is pattern efficiency which means minimum number of seeds to generate maximum number of test patterns. Stated another way the main objective of this architecture is to use a relatively low number of seeds to generate relatively large number of test patterns. A detailed description of this architecture and improvement thereto are set forth in an article, entitled: "On Using Twisted Ring Counters for Test Set Embedding in BIST" published in Journal of Electronic Testing: Theory and Applications, December, 2001.

Even though the implementation set forth in the above identified article is a significant improvement over other prior art techniques, there is a need to improve the disclosed techniques even further to meet the needs of high performance circuits. The current trend in circuit technology is to build denser high performance circuits. As the circuit becomes denser less space is available on chips to store test patterns or seeds to test these circuits. As a consequence it is believed the need for improvements over the techniques discussed in the article will even be greater to satisfy the demand of testing these denser high performance circuits.

SUMMARY OF THE INVENTION

Apparatus and method for testing electrical circuits includes an n-bit shift register buffering test patterns which are applied to inputs of a Device Under Test (DUT). The responses from the DUT are buffered in an m-bit shift register. A response monitor analyzes the responses and generates signals representing the result of the tests.

Positive and negative signals from the output of the n-bit shift registers are fed back from the output of the n-bit shift register to positive and negative inputs of a MUX whose output is operatively coupled to the n-bit shift register. The outputs from a circuit under test (CUT) is coupled to an M-bit shift register. The output from the m-bit shift register is fed back to another input of the MUX. A test pattern termed "seed" is generated and scanned in via another input of the MUX. A controller executes a selection algorithm and outputs control signals used by the MUX to select the inputs that provide test patterns which are scanned into the n-bit shift register.

The SEED is a reduced test pattern set which is generated and stored in a ROM. The present invention generates the full instruction set from the "Seed". The full instruction set is used to test circuits. The method used to generate the "Seed" is also covered in the present invention. A twisted ring generate executes a twisted-ring counter sequence on selected ones of a first test pattern set. The twisted-ring counter sequence generates a separate pattern set for each of the selected ones of the first test pattern set. As a separate pattern set is generated patterns that are common to the separate pattern set and the first pattern set are identified and discarded. A new one of the patterns remaining in the first test pattern set is selected and processed according to the twisted-ring counter sequence and common ones are discarded as set forth above. The process (including twisted-ring counter sequence operation and discard) set forth above is repeated until all patterns in the first test pattern set are processed.

The seeds are the patterns that cycle through the twisted-ring counter sequence. The Seed can be stored in ROM and used with the system according to the teachings of the present invention to test chips.

Other features and advantages of this invention will become apparent from the following detailed description of an embodiment of the invention, taken in conjunction with the accompanying drawings.

DETAILED DESCRIPTION OF THE ILLUSTRATED EMBODIMENT

This invention describes apparatus and method that generate tests to detect fault conditions in electrical circuits. It works well in generating stuck at fault tests and as such will be described in generating test patterns that detect that type of fault. However, this should not be construed as a limitation on the scope of the invention since it is well within the skill of one skilled in the art to use the teachings to generate tests for other types of fault conditions. Any such usage would be deemed covered by the claims of the present invention.

Figure 1:
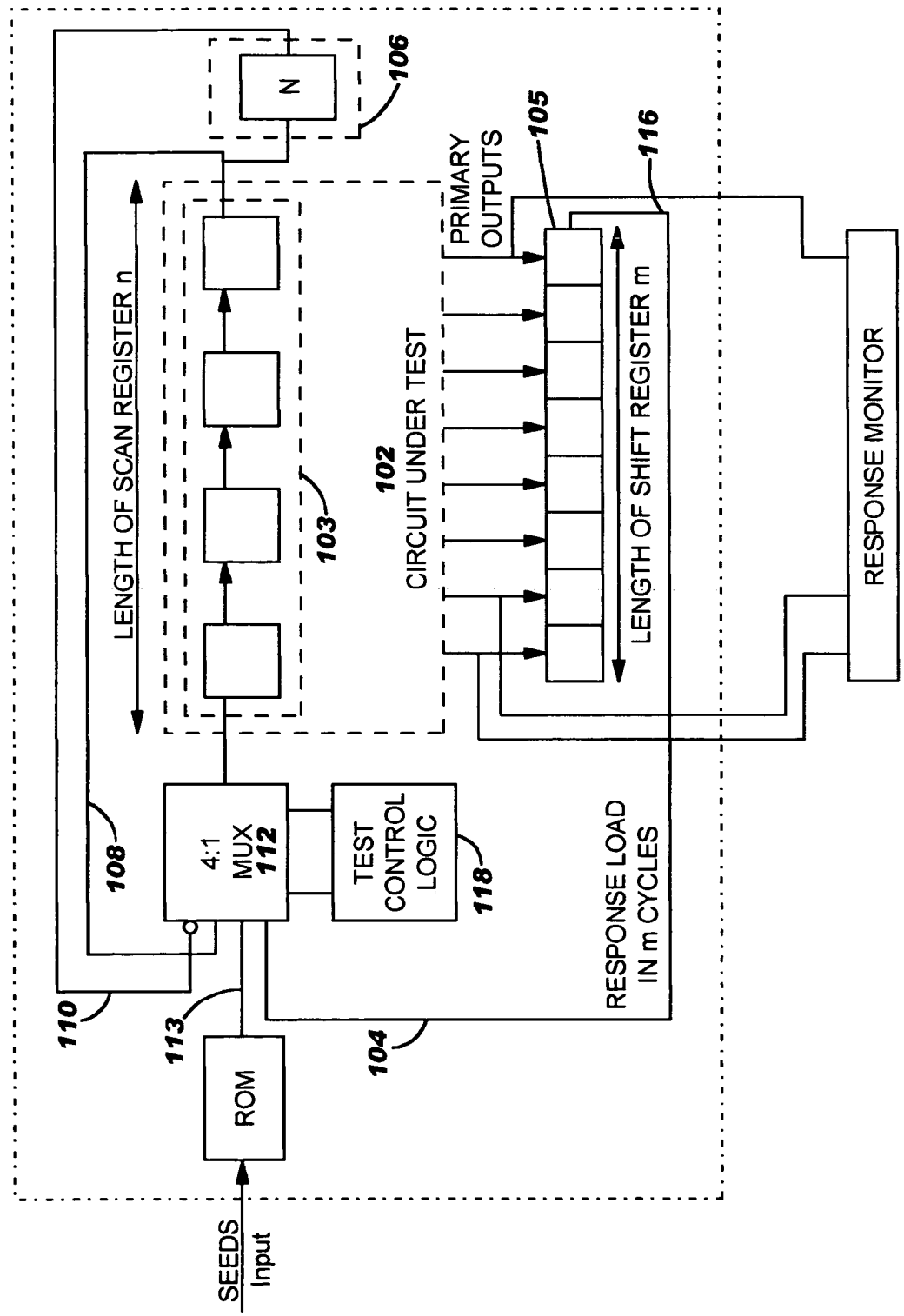
FIG. 1 shows a block diagram of an in-situ test system according to teachings of the present invention.

FIG. 1 shows a system 100 according to the teachings of the present invention. The system 100 includes Circuit Under Test (CUT) 102 operatively coupled to test generating system 104. The Circuit Under Test 102 can be any type of circuit including microprocessors pipelines and other scan-based circuit designs.

The test generating system 104 includes a scan-in chain 103 comprised of n scan registers. A circuit arrangement 106 generates positive and negative signals which are fed back on conductors 108 and 110 to MUX 112. The n shift registers provide the test pattern that is used to exercise the circuit under test. The responses of the test are fed over conductors into m-stage shift register 105. The output of the m-shift registers are fed back over conductor 116 to MUX 112. The seed pattern on conductor 113 can be provided from a ROM or a relatively low cost tester (not shown in the figure). Control signals for selecting which of the inputs to the MUX should be fed into the scan chain are provided by test control logic 118.

Figure 5:
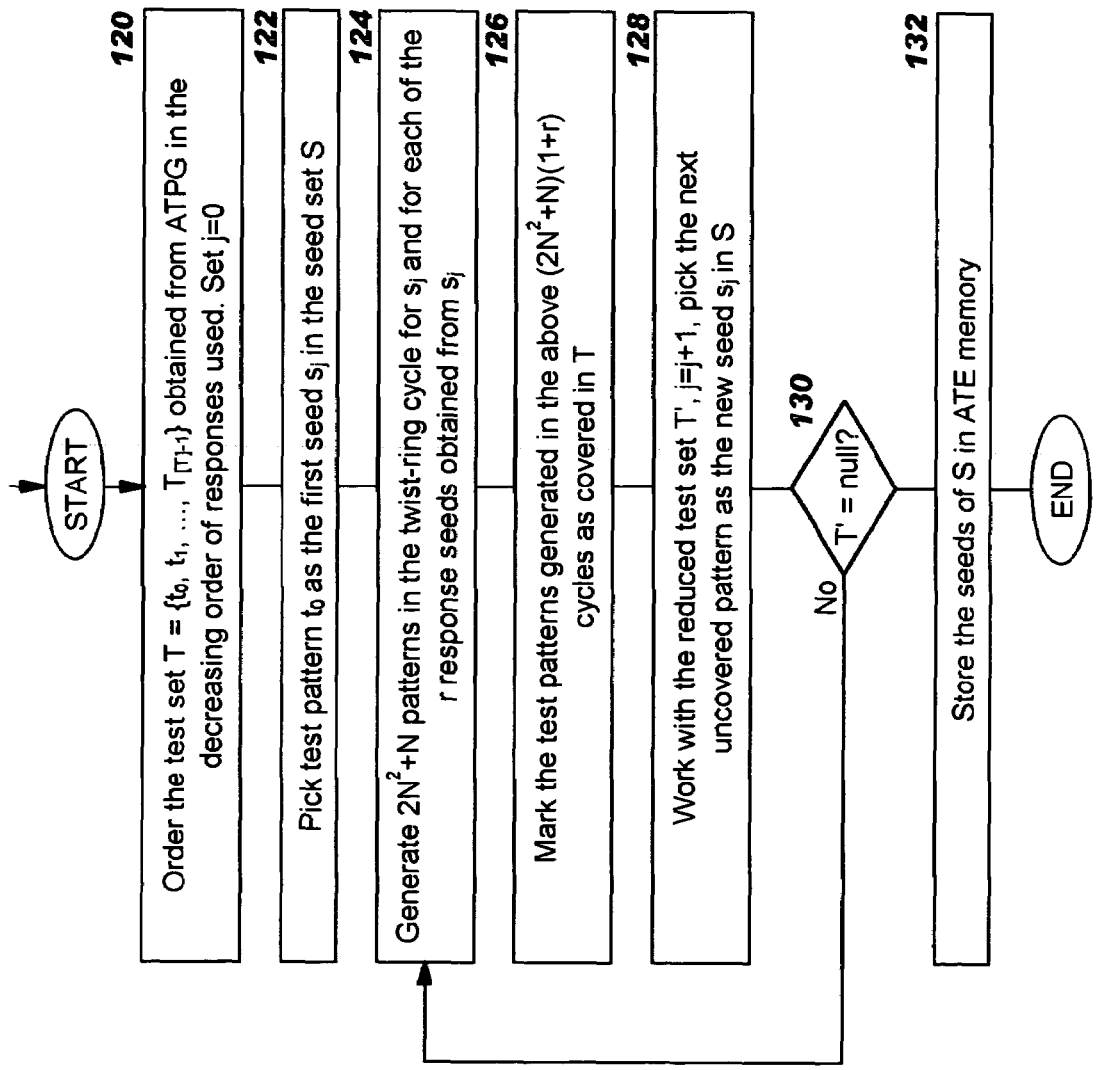
FIG. 5 shows flow chart of Seed Selection Algorithm.

FIG. 5 shows a flow chart of the Seed Selection Algorithm that generates seed patterns (seed and seed patterns are used interchangeably) which are provided on conductor 113 FIG. 1. The algorithm begins in the block labelled Start and terminates in the block labelled End. The respective blocks and associated function provided by each block are described as follows:

Block 120: Order the original test set T in the decreasing order of the response used.

Block 122: Pick test pattern 0 as first seed.

Block 124: Cycle thru (2N+1)N twist ring sequence.

Block 126: Mark patterns as they are covered in T.

Block 128: Start with smaller test set T' and pick the next uncovered pattern as second seed and so on.

Block 130: check if T' is empty.

Block 132: Store the seeds (of S) in memory.

As should be obvious to someone skilled in the art each act or step of the Seed Selection Algorithm FIG. 5 is represented by a block with function provided by the act written within the block.

Still referring to FIG. 5, ATPG (Automatic Test Pattern Generator) is a software program used to generate a test set based upon circuit description input to the program. This piece of software can be purchased or licensed off the shelf. The seed is generated according to the Seed Selection Algorithm described above and shown in FIG. 5.

Figure 2:
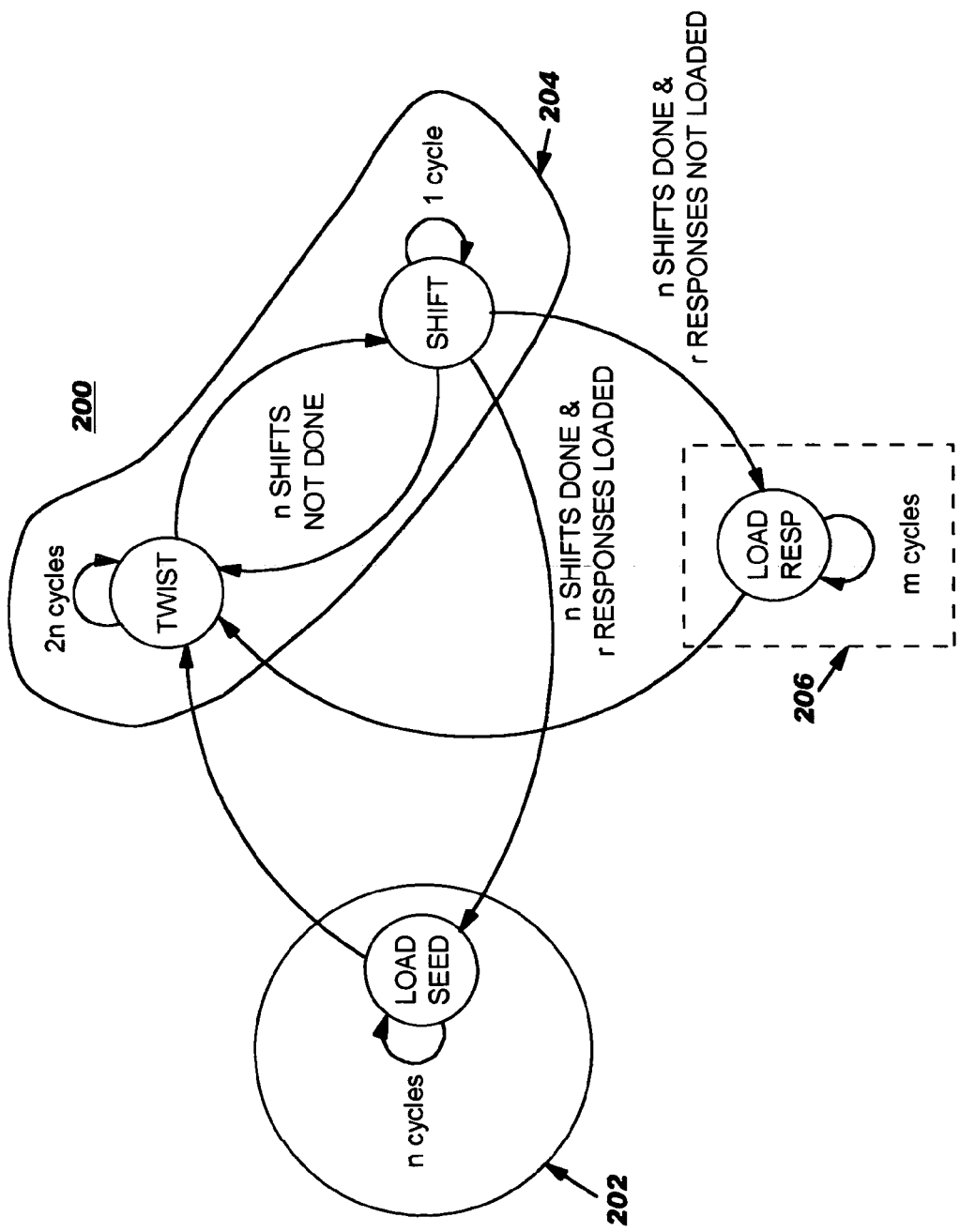
FIG. 2 shows a Finite State Machine (FSM) use to implement the test control logic.

FIG. 2 shows a finite state machine (FSM) 200 that can be used to generate the test control logic. Beginning at state 202 the seed is first loaded into the scan chain in n cycles. At state 204: It undergoes 2n twists+1 shift, n times, based on the maximum patterns obtainable from a twist or a shift. The response of the seed is then scanned-in into the n-input scan register in m cycles (state 206). The resulting pattern again undergoes (2n+1)n twist+shift cycles and the process is repeated. We define a parameter r for the number of responses used for each seed.

The value of r is determined by the following heuristic based on the transition count difference between a seed (s) and a resulting pattern generated by scanning the response (s') of the original seed. It can be proved that if the transition count difference between s and s' is greater than 3, s' could not have been embedded in the (2n+1)n patterns generated by s. Thus we can order the seeds of the seed set, such that a larger number of distinct patterns can be generated using r responses for first seed than for subsequent seeds. This intuitively ensures that we achieve higher fault coverage in a shorter time using a small set of seeds. With additional logic, if permissible, we can vary r for different seeds, in order to reduce the test application time.

The fault-free responses can be obtained by simulation. By inspection of the seed and its response, it can be decided whether to use the response based on the transition count difference.

Every seed generates (2n+1) n patterns. At the end of (2n+1)n cycles, we return to the original seed. If the transition count difference (detected in software program) between the seed and its response is greater than 3, we choose the response as the next seed and cycle through the twister-ring counter again starting with the 2n twist sequence. We continue this process until we hit a seed whose transition count difference is less than 3 compared to its response.

Figure 3:
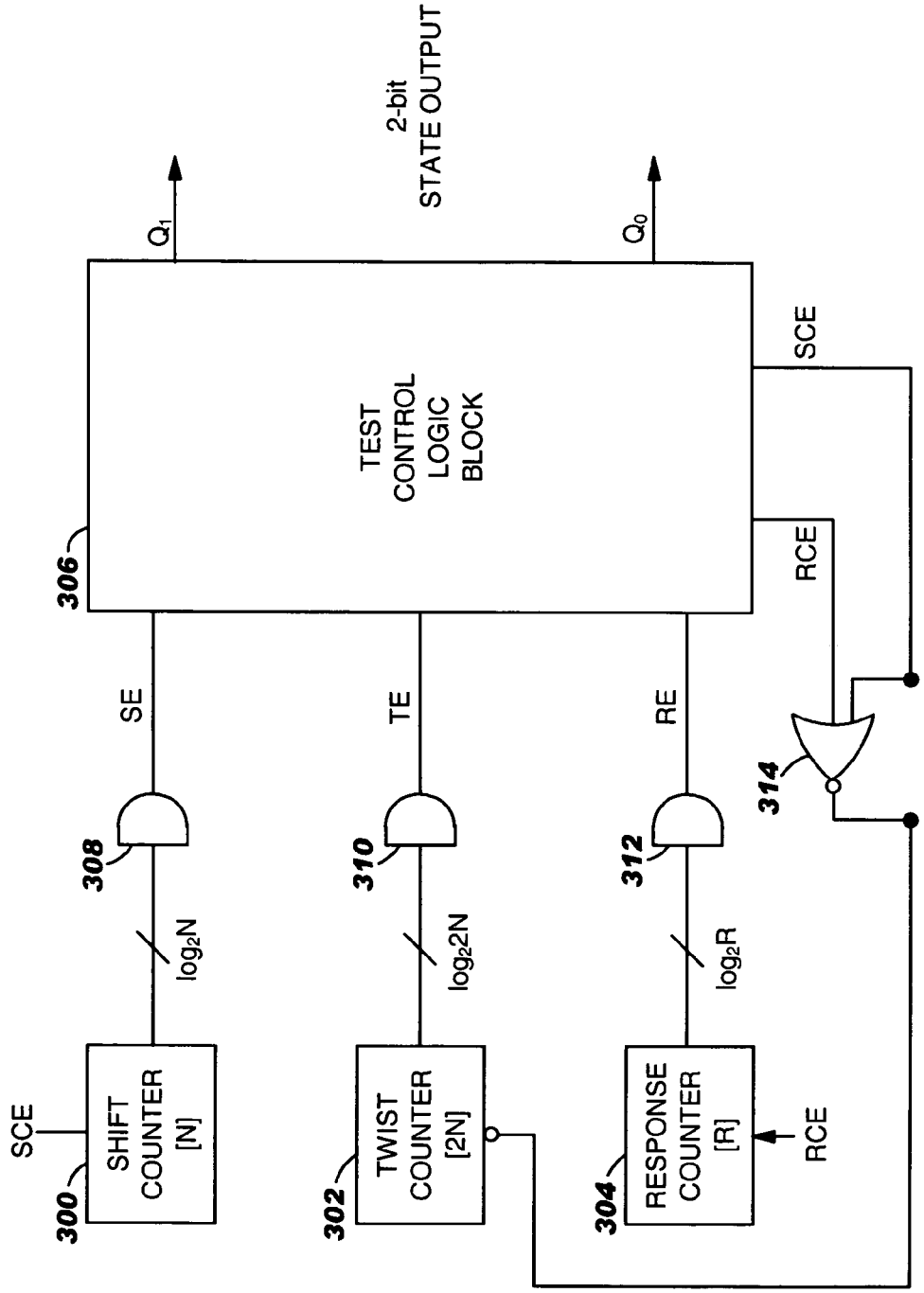
FIG. 3 shows a block diagram for the test control logic.

FIG. 3 shows a block diagram for the test control logic 118 (FIG. 1).

Blocks 300, 302, 304 are shift counter, twist counter and response counter, respectively. Each of the output states of the counters are anded in gates 308, 310 and 312 together to generate SE, TE and RE which controls the test control block (306). The two-bit state output is the control for the MUX selects.

Counter 300 counts N states in its $\log_2 N$ bits.

Counter 302 counts 2N states in its $\log_2 2N$ bits.

Counter 304 counts R states in its $\log_2 R$ bits.

Figure 4:
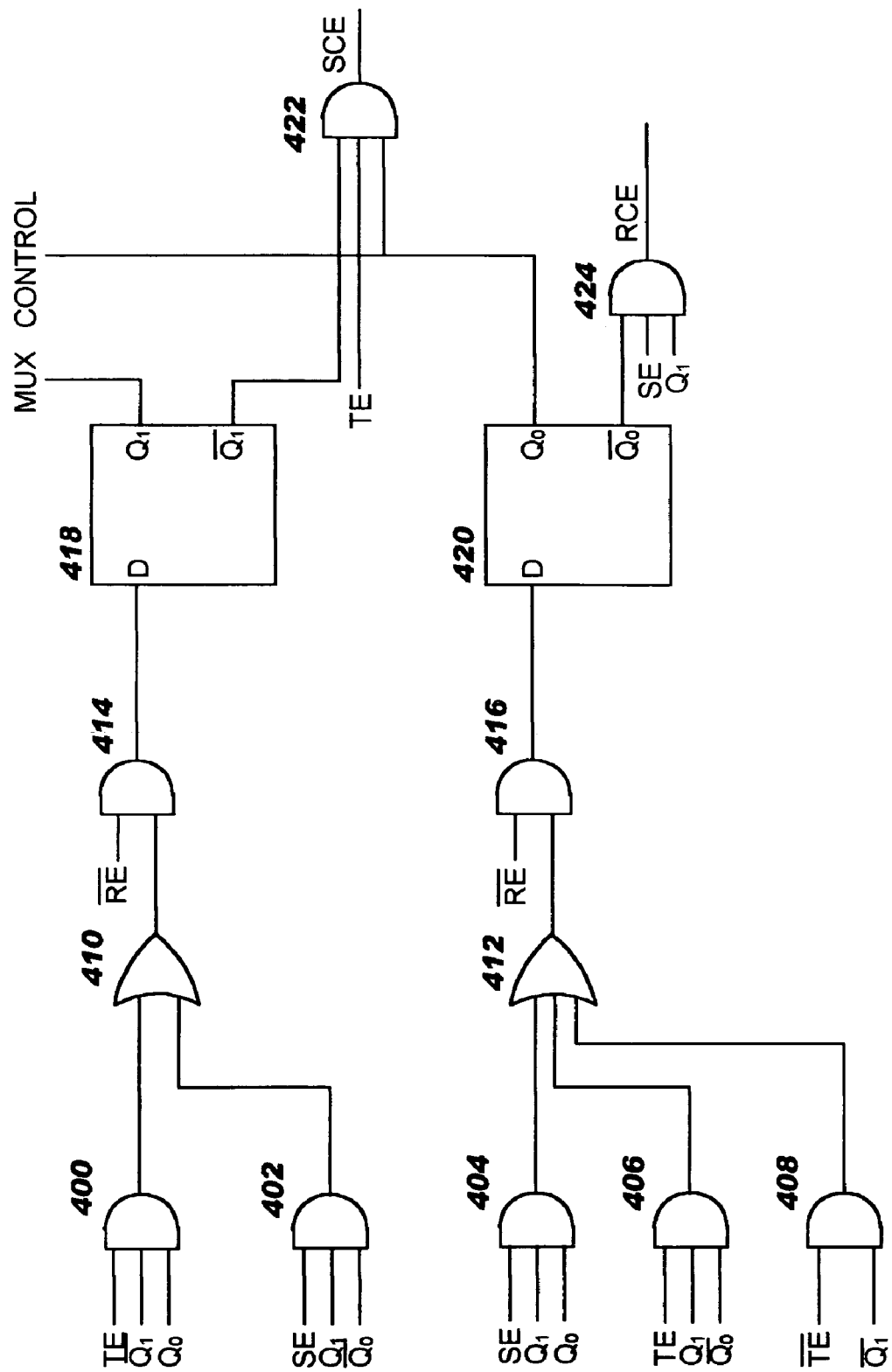
FIG. 4 shows detailed circuit diagram of the test control logic.

FIG. 4 is the detailed circuit diagram of the test control block 306 of FIG. 3. It contains 2 flip-flops 418, 420 and logic gates 400 through 416, 422 and 424. The named components are coupled as shown in FIG. 4. The flip-flops control the MUX selects in FIG. 1.

The three inputs TE, SE and RE form the random logic (FIG. 3) generating the next state of the flip-flops 418, 420 based on their current state. SCE and RCE via gate 314 control the enable pins of the twist counter, shift counter and response counter.

The change of flip-flop states {Q, Q0} force the MUX to go into one of the four possible states Load, Twist, Shift and Response Load, according to the finite state machine shown in FIG. 2.

The inputs D of the flip-flops are derived from the finite state machine expressed in state table format.

Table 1 lists abbreviations and full meanings as used in this document.

TABLE 1

| Abbreviation | Full Meaning |
| --- | --- |
| ATPG | Automatic Test Pattern Generator |
| ATE | Automatic Test Equipment (Hardware) |
| SCE | Shift Control Enable |
| RCE | Response Control Enable |
| SE | Shift Enable |
| TE | Twist Enable |
| RE | Response Enable |

Among the benefits provided by this invention are:

(1) Very Small Storage Requirements: no need for expensive testers.

(2) Low hardware overhead (just three counters for shifts, twists and responses, an m-bit scan register (for m outputs), MUX and a few gates to implement the FSM for the test control logic).

(3) Test length of the order O(n power 2)<<O(2 power n) of LFSR-based methods.

(4) Scalable BIST architecture: counter sizes need to increase to support larger m and n.

(5) 100% fault coverage (including hard-to-detect faults) as complete test set is embedded in the TRC (TWISTED RING COUNTER) sequence.

(6) No modifications to the CUT required except scan; therefore highly suitable for hard cores.

(7) Does not require post-ATPG (AUTOMATIC TEST PATTERN GENERATION) logic insertion; hence conforms to methodology requirements.

While the invention has been particularly shown and described with references to an embodiment, it will be understood by those skilled in the art that various changes in both form and detail may be made therein without departing from the scope and spirit of the invention.

Having thus described my invention what I claim is as follows:

1. A system comprising:
   an n-bit shift register to buffer an n bit test pattern;
   a circuit arrangement responsive to output signal from said n-bit shift register to generate positive and negative signals from said output signal;

an m-bit shift register for buffering response signals;

a MUX having an output operatively coupled to the n-bit shift register, a first input operatively and directly coupled to the output of the m-bit shift register, second and third inputs for receiving the positive and negative signals, respectively, a fourth input for receiving seed pattern signals and a fifth input to receive a control signal; and a logic circuit to generate the control signal, wherein the logic circuit is implemented by a finite state machine comprising a single twist state and a single shift state and a single response state.

2. The system of claim 1 further including memory, operatively coupled to the fourth input, to store the seed pattern.

3. The system of claim 2 wherein the memory includes a ROM.

4. The system of claim 1 further including a Circuit Under Test (CUT) having inputs operatively coupled to the n-bit shift registers and outputs operatively coupled to the m-bits shift register.

5. The system of claim 4 further including a response monitor analyzing responses from the m-bits shift register to identify fault conditions in said CUT.

6. The system of claim 1 wherein the logic circuit includes a generator generating $2N^2+N$ patterns in a twist-ring cycle.

7. The system of claim 1 wherein the logic circuit includes a test control logic block generating a first pair and a second pair of control signals;

first, second and third logical AND gates arranged in parallel and generating SE, TE and RE signals coupled to said test control logic block;

a first shift counter responsive to one of the second pair of control signals to generate a $Log_2 N$ signal supplied to first AND gate;

a second shift counter responsive to a control signal generated from said second pair of control signal to generate a $Log_2 2N$ signal supplied to second AND gate; and a response counter responsive to another of said second pair of control signals to generate a signal applied to the third AND gate.

8. A method comprising:

generating seed patterns to test fault conditions in electrical circuits;

generating positive and negative signals from a first shift register that provides input test patterns to the circuits;

generating response signals from a second shift register used to buffer responses from said circuits; and correlating the seed patterns, positive signals, negative signals and response signals and generating control signals from a Finite State Machine with a single twist state and a single shift state and a single response state to generate the input test patterns loaded into the first shift register.

9. The method of claim 8 wherein the fault conditions include single stuck-at fault.

10. The method of claim 9 wherein the seed patterns generation includes (a) generating a first test pattern set from an Automatic Test Pattern Generator (ATPG);

(b) selecting one of the test patterns from said first test pattern set;

(c) generating from the selected one of the test patterns $2N^2+N$ patterns in a twisted ring counter sequence; wherein N represents length of the scan chain in the CUT;

(d) correlating patterns in (c) with the first test pattern set;

(e) discarding test patterns common to patterns in (a) and (c);

(f) selecting another test pattern from remaining test pattern set;

(g) generating from the selected another test pattern $2N^2+N$ patterns in a twisted ring counter sequence;

(h) correlating patterns in (g) and (f)

(i) discarding test patterns common to patterns in (g) and (f);

(j) repeating (f) through (i) until none of the pattern is left in the first test pattern set.

11. The method of claim 10 further including storing in a memory non-discarded test patterns to be used as seed pattern.

12. The method of claim 10 wherein the patterns in the first test pattern set are sorted in descending order prior to practicing (b) through (j).

13. The method of claim 8 wherein correlating includes inputting the seed patterns and other signals into a MUX; and inputting into said MUX a control signal to identify which of the inputs is used by said MUX per machine cycle to generate the scanning pattern.

14. A method comprising:

(a) providing a first test pattern set for testing fault condition of electrical circuits;

(b) selecting one of the test patterns from said first test pattern set;

(c) generating from the selected one of the test patterns $2N^2+N$ patterns in a twisted ring counter sequence; wherein N represents the length of the scan chain in the CUT, and wherein the $2N^2+N$ patterns are generated by a Finite State Machine with a single shift state, a single twist state, and a response state;

(d) correlating patterns in (c) with the first test pattern;

(e) discarding test patterns common to patterns in (a) and (c);

(f) selecting another test pattern set;

(g) repeating (c) through (f) until none of the pattern is left in the first test pattern set.

15. The method of claim 14 wherein the first test pattern set is being generated by an Automatic Test Pattern Generator based upon circuit description inputted to said Automatic Test Pattern Generator.

* * * * *